United States Patent
Newman et al.

(10) Patent No.: US 9,885,770 B2
(45) Date of Patent: Feb. 6, 2018

(54) SYSTEM AND METHOD FOR DETECTING ANGLE AMBIGUITY IN OPTICAL SENSORS

(71) Applicant: ELBIT SYSTEMS OF AMERICA, LLC, Fort Worth, TX (US)

(72) Inventors: Greg Newman, Keller, TX (US); James Woosley, Flower Mound, TX (US)

(73) Assignee: Elbit Systems of America, LLC, Fort Worth, TX (US)

( * ) Notice: Subject to any disclaimer, the term of this patent is extended or adjusted under 35 U.S.C. 154(b) by 205 days.

(21) Appl. No.: 14/830,047

(22) Filed: Aug. 19, 2015

(65) Prior Publication Data

US 2017/0052244 A1    Feb. 23, 2017

(51) Int. Cl.
*H01L 27/14* (2006.01)
*G01S 3/784* (2006.01)
*H01L 27/146* (2006.01)

(52) U.S. Cl.
CPC ........ *G01S 3/784* (2013.01); *H01L 27/14605* (2013.01); *H01L 27/14607* (2013.01); *H01L 27/14609* (2013.01)

(58) Field of Classification Search
CPC ............... G01S 3/784; H01L 27/14609; H01L 27/14607; H01L 27/14605
See application file for complete search history.

(56) References Cited

U.S. PATENT DOCUMENTS

| 6,274,862 B1 | 8/2001 | Rieger |
| 2006/0109241 A1 | 5/2006 | Dueweke et al. |
| 2014/0264043 A1 | 9/2014 | Ganguly et al. |
| 2014/0338205 A1 | 11/2014 | Dumoulin |

FOREIGN PATENT DOCUMENTS

| EP | 1876415 | * | 1/2008 |
| WO | 2004059346 |  | 7/2004 |

OTHER PUBLICATIONS

International Search Report and Written Opinion for PCT Application No. PCT/US2016/047853, dated Nov. 29, 2016.

* cited by examiner

*Primary Examiner* — Tony Ko
(74) *Attorney, Agent, or Firm* — Conley Rose, P.C.

(57) ABSTRACT

There is provided in a first form, an apparatus. The apparatus includes a detector array having a plurality of elements, the detector array comprising a photosensitive material and a photosensitive region disposed about and distinct from the plurality of elements. Electrical circuitry is coupled to each of the elements of the detector array. The electrical circuitry is configured to generate a set of first signals, each first signal of the set of first signals is based on optical energy impinging on a respective one of the plurality of elements of the detector array. The photosensitive region is coupled to the electrical circuitry and the electrical circuitry is configured to generate a second signal having a first value if no portion of optical energy impinging on the plurality of elements of the detector array impinges on the region disposed about the plurality of elements of the detector array. The second signal has a second value, distinct from the first value, if a portion of an optical energy impinging on the plurality of elements of the detector array impinges on the photosensitive region disposed about the plurality of elements of the detector array, the portion of the optical energy impinging on the photosensitive region disposed about the plurality of elements exceeds a threshold energy.

21 Claims, 8 Drawing Sheets

SYSTEM AND METHOD FOR DETECTING ANGLE AMBIGUITY IN OPTICAL SENSORS

CROSS-REFERENCE TO RELATED APPLICATIONS

None

TECHNICAL FIELD

The present invention relates to optical sensors, and, in particular, to systems and methods for detecting angle ambiguity in a semi-active laser sensor.

BACKGROUND

In semi-active laser (SAL) sensor and similar optical sensor systems, optical energy in the light from a distant source is collected by a condenser lens system that converges the energy in the direction of a detector array. For laser light entering the optical sensor system at its limit of its field of view a portion of the optical energy from the laser light may fall outside of the active area of the detector, resulting in an ambiguity of the angle of incidence reported by the sensor.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, other companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

"Distant source" means, in the context of an optical sensor system, an object the light from which may be represented in a geometric optic sense by rays that are substantially parallel. A distant source can be either an object that is an active generator of light or, alternatively, a passive reflector of light from such an active generator, such as a laser for example, which active generator need itself not be "seen" by the optical sensor system.

"Light" means electromagnetic radiation having wavelengths spanning a spectral range from the infrared through the visible spectrum. Light as used herein is not limited to the portion of the electromagnetic spectrum detectable by the human visual system.

"Oblique pencil" means a pencil of light rays that intersects an optical axis of an optical sensor system at a nonzero angle.

"Exemplary means "serving as an example, instance, or illustration." An embodiment described herein as "exemplary" is not necessarily to be construed as preferred or advantageous over other embodiments.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
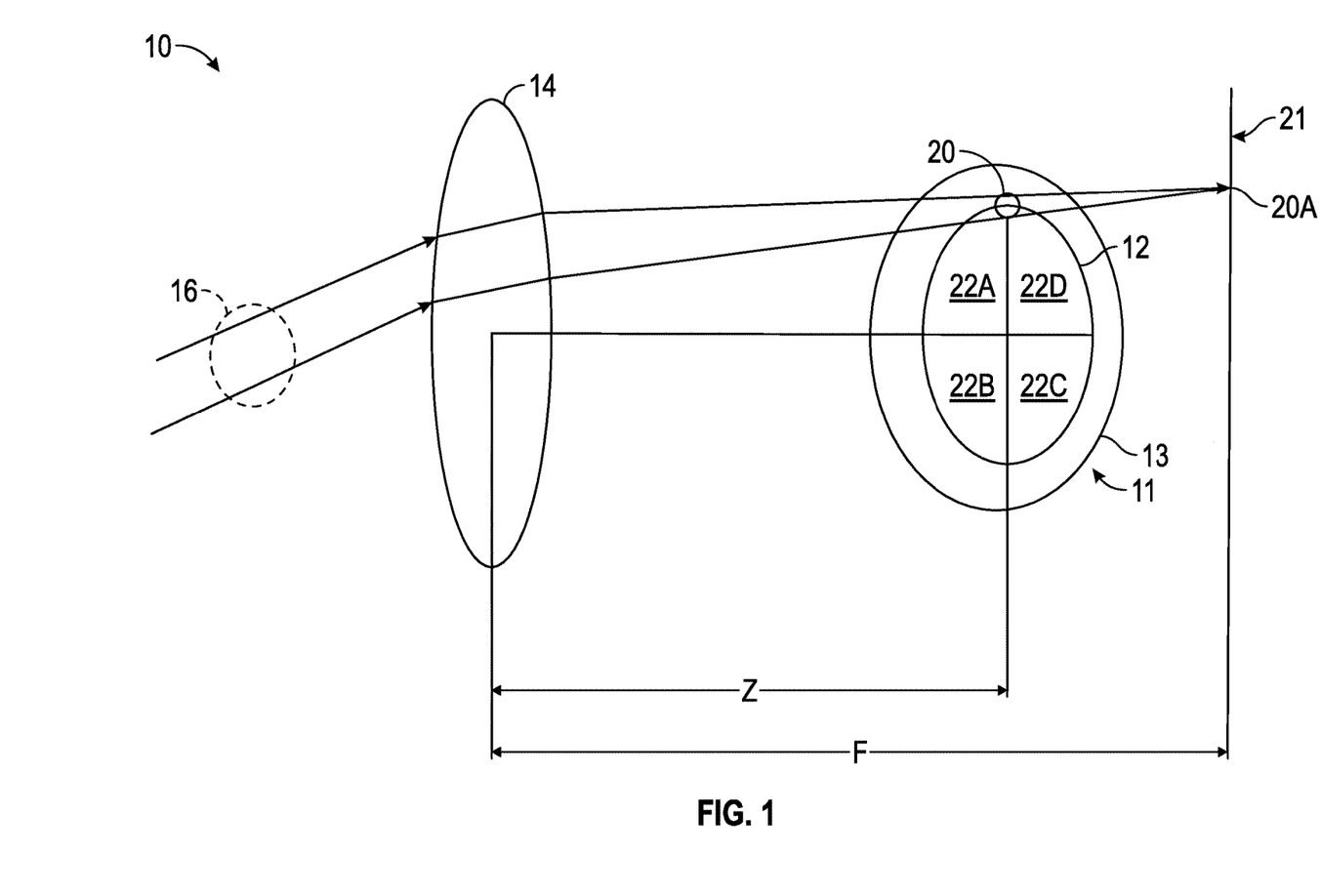
FIG. 1 shows a simplified schematic illustration of an optical sensor system in accordance with at least some embodiments of the disclosure.

FIG. 1 depicts a schematic illustration of an optical sensor system 10 in accordance with at least some embodiments of the principles disclosed herein. In particular, FIG. 1 demonstrates the geometric optic aspects of the disclosed embodiments. Optical sensor system 10 includes a detector 11 including detector array 12, which for ease of illustration in FIG. 1 will be taken to be circular. In at least some embodiments, a detector array may include a plurality of elements, the size and geometry of which may be selected in accordance with a particular application of the detector system. In the example of FIG. 1, detector array 12 includes four photosensitive elements 22A, 22B, 22C and 22D partitioning detector array 12 into segments or, in the example of FIG. 1, four quadrants. Detector array 12 including four elements is exemplary and, other detector array embodiments having other numbers of elements may be used. An example of one such detector array will be described further below in conjunction with FIG. 4. Detector array 12 may comprise a photosensitive material, such as a semiconductor, e.g. silicon (Si), cadmium sulphide (CdS), gallium arsenide (GaAs), or mercury-cadmium telluride (HgCdTe). Further still, detector array may be comprise a photosensitive device such as a photo-resistor, photo-conductor, photo-diode, photo-transistor, avalanche photo-diode or charge-coupled device. The aforementioned devices are exemplary, and the principles disclosed herein are not confined to particular photo-device embodiments. In each embodiment, the elements, 22A-22D in the exemplary embodiment in FIG. 1, are electrically isolated from each other. An outer ring 13, described further below, may be disposed about detector array 12. Outer ring 13 may be fabricated from the same material as detector array 12, by for example etching a portion of a material substrate comprising the detector, and thereby be electrically isolated from each of the photosensitive elements 22A-22D of detector array 12.

A lens system 14 images objects onto detector array 12. Again, for ease of illustration, lens system 14 is depicted as a single, simple lens. It would be appreciated by those skilled in the art having the benefit of the disclosure that any suitable lens configuration forming a real image may be used in embodiments of lens system 14. In the exemplary embodiment in FIG. 1, detector array 12 may not lie in focal plane 21 of lens system 14 which is taken to be at a distance F from lens system 14. Rather, detector array may be disposed between lens system 14 and the focal plane, at a distance denoted Z in FIG. 1.

Light from a distant source falling on sensor system 10 may be imaged by lens system 14. A pencil of light rays emanating from such an object is depicted by pencil 16. For the purpose of illustration, the distant source is taken to be disposed such that pencil 16 is oblique to sensor system 10. A pencil of light rays from a distant object may comprise substantially parallel light rays as illustrated by pencil 16. (It would be understood that the distant source of pencil 16 is itself not seen in FIG. 1 by reason of scale.) Because detector array 12 may be positioned in front of the focal plane of lens system 14, the image at the detector array may form a "spot" having a diameter larger than would otherwise obtain if the detector array were positioned at the focal plane of lens system 14 where it is focused at point 20A. Pencil 16 forms an image spot 20 that is depicted, for purposes of illustration, to lie near the periphery of detector array 12. In particular, a portion of spot 20 lies outside the edge of photosensitive elements 22A and 22D and falls on outer ring 13.

If a portion of the light optical energy incident on the detector array simultaneously impinges on multiple elements in the detector array, then the sensor can determine the angle of incidence of the radiation entering the sensor. Thus, for example in detector array embodiment comprised of four elements disposed in quadrants as in FIG. 1, the sensor may be able to determine the angle of incidence in either one or both of the mutually perpendicular directions defining the quadrants of the detector array. Otherwise, a determination of the angle of incidence may be ambiguous. By way of example, the angle of incidence determination with respect to the source having the image spot 20 falling near the periphery of the detector array may be ambiguous as described further below.

Figure 2:
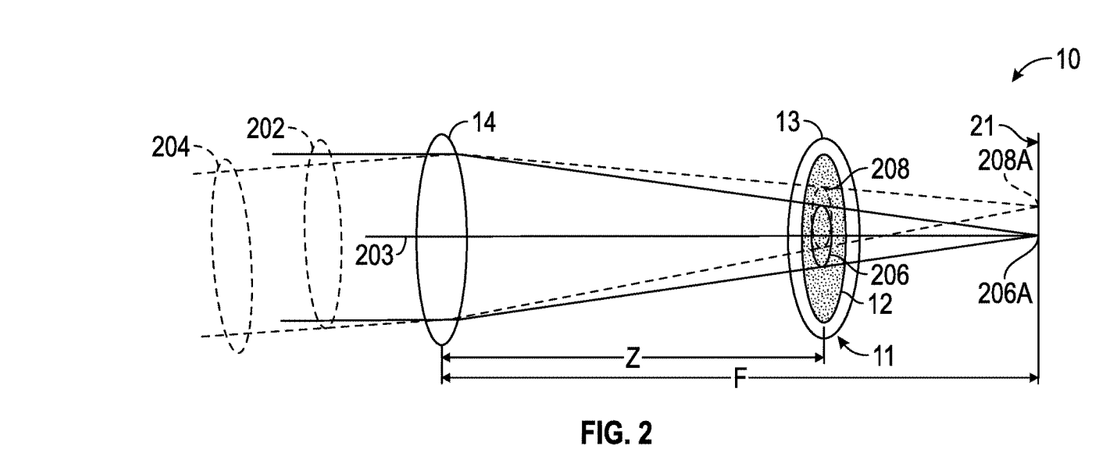
FIG. 2 shows, in a side oblique view, further aspects of the system of FIG. 1.

This may be further understood by referring to FIGS. 2 and 2A-2E showing a schematic illustration of an optical sensor system 10 and depicting further geometric optic aspects thereof. In FIG. 2, a pencil of rays 202 from a distant object taken to be on-axis (pencil parallel to axis 203) in elevation but off-axis in azimuth (not visible in the view of FIG. 2) is directed onto detector array 12 by lens system 14. The image of pencil 202 forms a spot 206 on detector array 12, as previously described in conjunction with FIG. 1. Spot 206 and others shown in conjunction with FIGS. 2A-2E are taken to be circular for ease of illustration. A distant object taken to be off-axis in both elevation and azimuth, depicted by a pencil of rays 204 is imaged by lens system 14 in a spot 208 on detector array 12. Spot 208 is displaced vertically relative to spot 206. At the focal plane 21 of lens system 14, spots 206 and 208 are imaged at points 206A and 208A, respectively. In the side view of FIG. 2, the azimuthal displacements of spots 206 and 208 are not visible but will be discussed below in conjunction with FIG. 2A.

Figure 2A:
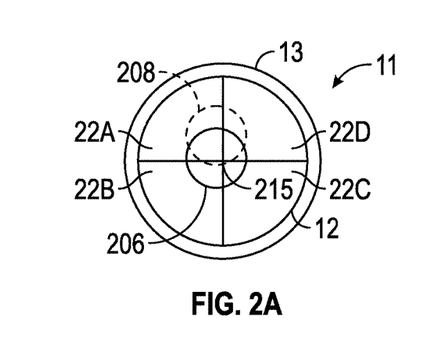
FIG. 2A shows, in a front elevation view, a portion of the system of FIG. 2.

Turning to FIG. 2A, there is depicted therein a front elevation view of detector 12. Recall spot 206 is the image of the pencil 202 by lens system 14, representing a distant object that is on-axis in elevation and off-axis in azimuth. Portions of the optical energy contained in spot 206 impinge on each of photosensitive elements 22A-22D. Further, spot 206 is seen to be centered vertically on detector array 12, reflecting the on-axis in elevation disposition of the distant object represented by pencil 202. However, spot 206 is displaced horizontally from the center 215 of detector array 12, reflecting the off-axis in azimuth disposition of the distant object represented by pencil 202.

Consider now spot 208, depicting the image formed by lens system 14 on detector array 12 of pencil 204. Recall, pencil 204 represents a distant object that is off-axis in both elevation and azimuth. Spot 208 is displaced vertically from the center of detector array 12 as well as displaced horizontally from the center 215 of detector array 12. Nevertheless, portions of the optical energy of spot 208 are seen to still fall on each of photosensitive elements 22A-22D. The relative amounts of the optical energy that impinges on the four elements is, however different than in the case of spot 206. This partitioning of the optical energy among the elements of detector array 12 may be used to determine the angle of incidence of an object imaged by lens system 14 on detector array 12, as now described in conjunction with Equations (1) and (2).

Normalized angles of incidence relative to orthogonal axes (labeled x, y) which define the four quadrants 22A-22D, $\alpha_x$ and $\alpha_y$, may be determined from Equations (1) and (2):

$$\alpha_x = ((S_A+S_B)-(S_C+S_D))/(S_A+S_B+S_C+S_D) \quad (1)$$

$$\alpha_y = ((S_A+S_D)-(S_B+S_C))/(S_A+S_B+S_C+S_D) \quad (2)$$

In Equations (1) and (2) the variables $S_A$, $S_B$, $S_C$, and $S_D$, represent the signals generated by the respective elements of the detector array 12, e.g. photosensitive elements 22A-22D. Each of these signals is generated in response to the light falling in the respective quadrant, which are portions of the light imaged on detector array 12 as set forth above. The signals may be proportional to the optical power falling on the detector. As defined by Equations (1) and (2), $\alpha_x$ and $\alpha_y$ are normalized and the strength, or intensity, of the radiation impinging on the detector array does not affect the value of $\alpha_x$ and $\alpha_y$, within the linear operating regime of the detector array. If the position of the spot is displaced sufficiently, the spot may lie outside the linear operating regime of detector 11, and the associated electronics as will be described further below. The values of $\alpha_x$ and $\alpha_y$ determined using Equations 1 and 2 for an object whose radiation is impinging on sensor system 10 may be used to determine an angle of incidence for that object. If $\theta_y$ is the angle-of incidence relative to the y-axis for a calibration test object that produces a value of $\alpha_y = \pm 1$, then the angle of incidence of an object generating a value $\alpha_y = A_y$, may be determined by $\theta_y * A_y$. The angle of incidence relative to the x-axis may be determined analogously. The linear field-of-view (FOV) of system 10 may be defined by the smallest angles in the x and y axes that satisfy the condition that the values of $\alpha_x$ and $\alpha_y$ as determined from Equations (1) and (2) are each equal to 1, in absolute value (i.e. ±1), provided a portion of the spot impinges on each of the photosensitive elements 22A-22D.

To further appreciate the principles as exemplified by the disclosed embodiments, consider now FIGS. 2B-2E, showing in a front elevation view, further aspects of the detector 11 and detector array 12.

Figure 2B:
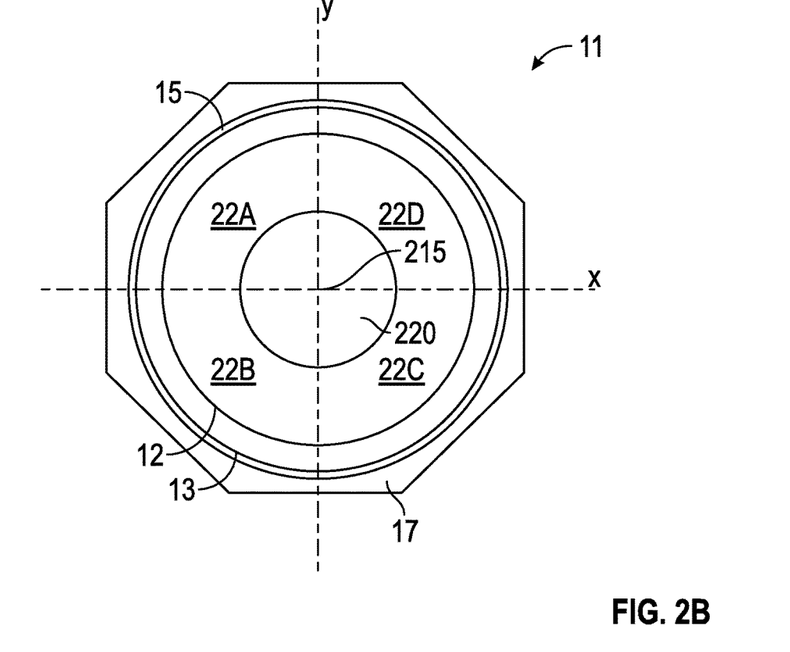
FIG. 2B shows, in a front elevation view, further aspects of a portion of the system of FIG. 2.

Turning first to FIG. 2B, illustrating the image spot geometry as imaged on detector array 12. Detector 11 may also include outer ring 13 which may comprise a photosensitive material, as previously described, and in particular the same photosensitive material as used for photosensitive elements 22A-22D. Guard ring 15 may be coupled to an electrical ground which provides a reference potential and isolation for photoelectric signals generated by each of photosensitive elements 22A-22D in response to optical radiation falling thereon. Further, a peripheral region 17 may be disposed outside of guard ring 15 and comprising the substrate material on which photosensitive elements 22A-22D and outer ring 13 are etched, for example Si or other semiconductor, for example. Peripheral region 17 may be formed by cutting detector 11 from a wafer of substrate material after etching to form the segments comprising photosensitive elements 22A-22D, and optionally, outer ring 13. Peripheral region 17 may have an octagonal shape as in the example in FIG. 2B, however the principles of the disclosure do not depend on the particular shape of peripheral region 17, and, in other embodiments shapes other than an octagon may be produced in the fabrication of detector 11. Still other embodiments may be fabricated without a peripheral region 17. Further, in some embodiments, outer ring 13 may be omitted, as described below. Spot pattern 220 represents the image spot of a distant source imaged on detector 11 in which the distant source is on-axis both azimuthally and in elevation. Spot pattern 220 is seen to be substantially centered on detector array 12.

Figure 2C:
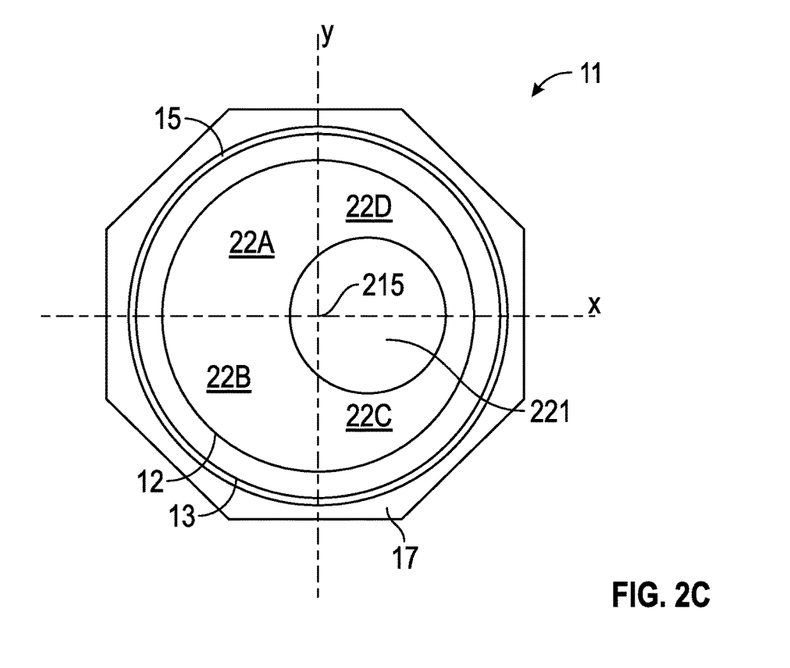
FIG. 2C shows, in a front elevation view, further aspects of a portion of the system of FIG. 2.

Turning now to FIG. 2O, a spot pattern 221 is shown corresponding to a the image spot of a distant source, on-axis in elevation and off-axis in azimuth, analogous to spot 208 in FIG. 2A. Spot pattern 221 is displaced in the horizontal, or "X", direction such that it is substantially vertically centered to the right of the center 215 of detector array 12. A portion of the optical energy in the image represented by spot pattern 221 falls on each of the photosensitive elements 22A-22D and the image may thus be in the linear FOV of detector 11. In this case, $0=S_A=S_B<S_C=S_D$, and Equations (1) and (2) yield, $\alpha_y=0$, $0<\alpha_x<1$.

Figure 2D:
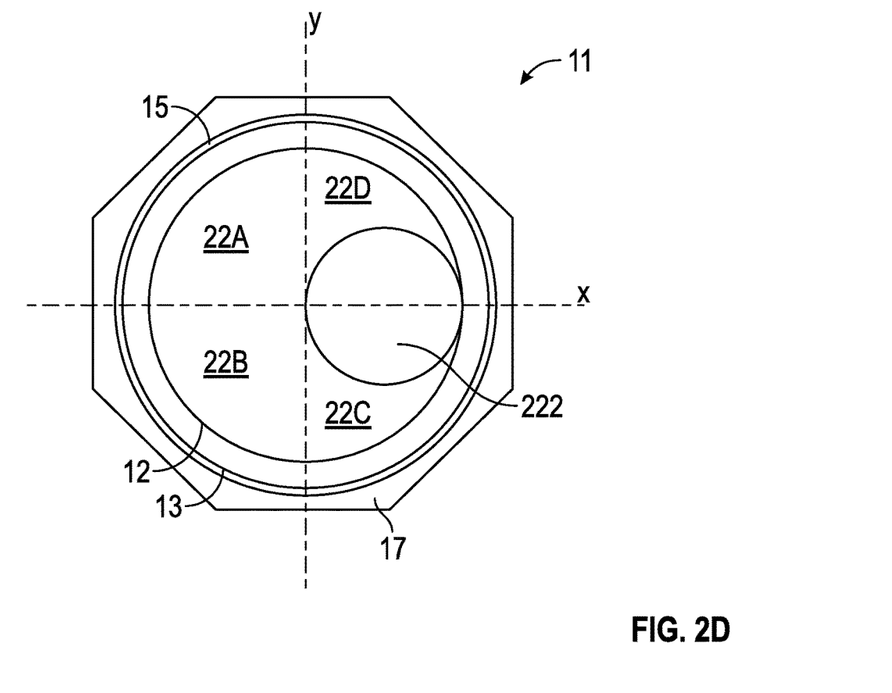
FIG. 2D shows, in a front elevation view, further aspects of a portion of the system of FIG. 2.

Referring now to FIG. 2D, spot pattern 222 represents the image spot of a distant source similar to spot pattern 221 in FIG. 2O, albeit disposed further off-axis. In this example, no portion of the optical energy falling on detector array 12 strikes photosensitive elements 22A and 22B. For the example of FIG. 2D, $S_A=S_B=0$, and $S_C=S_D$, and the normalized angular position of the distant source is $\alpha_x=1$ and $\alpha_y=0$, from Equations (1) and (2), respectively. Thus, spot pattern 222 corresponds to a distant source at the limit of the linear FOV of optical sensor system 10. Any further displacement in the horizontal direction of the image represented by spot pattern 222 may yield the same value of normalized horizontal angle of incidence, $\alpha_x=1$, although $S_C$ and $S_D$ may decrease as a portion of the optical energy misses detector array 12, the normalization maintains the value of $\alpha_x$. Stated otherwise, the normalized angle of incidence may be saturated and the image may no longer be within the linear FOV of detector 11. To further appreciate this operating regime of optical sensor system 10, turn now to FIG. 2E.

Figure 2E:
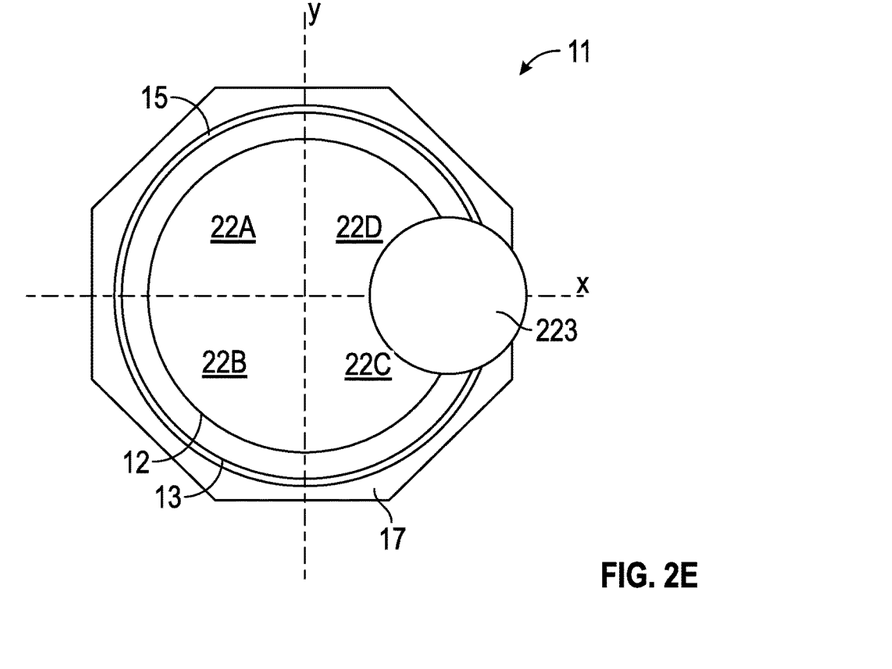
FIG. 2E shows, in a front elevation view, further aspects of a portion of the system of FIG. 2.

In FIG. 2E, spot pattern 223 represents the image spot of a distant source similar to spot pattern 222 in FIG. 2D, albeit disposed further off-axis still. A portion of image spot 223 misses detector array 12 and strikes outer ring 13 and a smaller portion falls on peripheral region 17. Depending on the photoelectric characteristics of the detector elements and the characteristics of the associated electrical circuitry, described further below, and the intensity of the source, the angle of incidence as determined from the signals from the detector elements may remain saturated. However, at some point, with increasing horizontal displacement, the optical power may be insufficient for the electrical circuitry, which generates signals $S_C$ and $S_D$, in response to photocurrents in the detector elements, to maintain the normalization. Consequently, the value of $\alpha_x$ as determined by optical sensor system 10 may then be again less than 1 as in FIG. 2C although the image spot topology in FIGS. 2C and 2E is different. Thus, there can be an ambiguity in determining the angle of incidence of a distant object as it moves off the axis of sensor system 10. While FIGS. 2A-2E trace the evolution of the origin of such an ambiguity, in operation of an optical sensor system, without more, the system is only aware of a value of $\alpha_x \le 1$ and cannot discriminate between the topology of FIG. 2C and that of FIG. 2E. Techniques to resolve the ambiguity in accordance with at least some embodiments will now be described in conjunction with FIGS. 3A, 3B and 4.

Figure 3A:
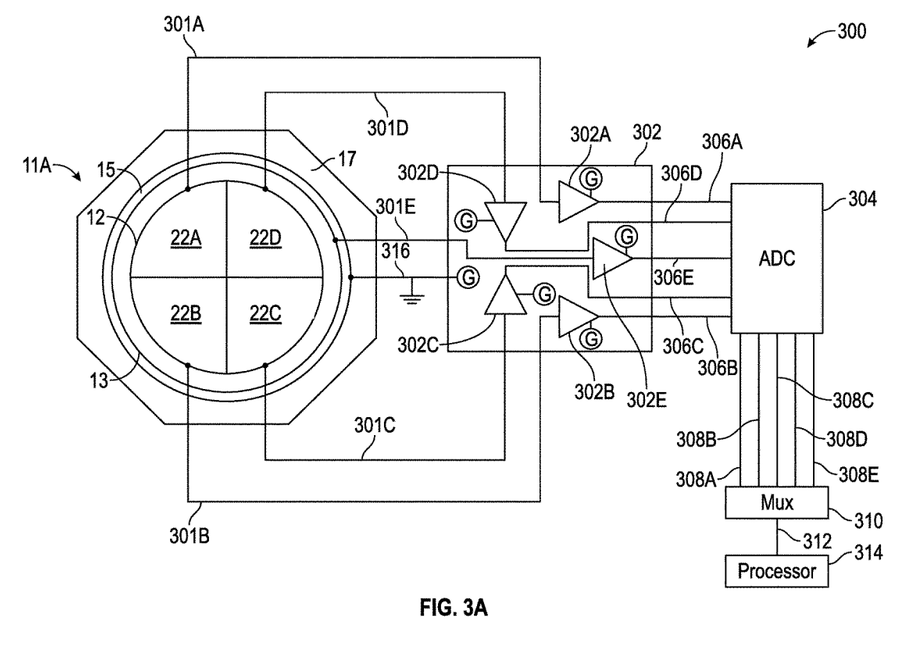
FIG. 3A shows a block diagram of a detector and electrical circuitry in accordance with at least some embodiments.

Turning first to FIG. 3A, there is shown an exemplary detector 11A coupled to electrical circuitry 300 including amplifiers 302A-302E, and an analog to digital convertor (ADC) 304 for generating a digital representation of each analog output signal from amplifiers 302A-302E. In the example of FIG. 3, amplifiers 302A-302E are shown as components of an integrated amplifier block 302, however, in other embodiments each amplifier 302A-302E may be implemented as a discrete circuit. Amplifier 302A may be electrically coupled to element 22A of detector 11 and amplify a photocurrent 301A generated in element 22A by photons in an image spot from a distant source impinging on it, as described above. Likewise, amplifiers 302B-302D may amplify the photocurrents 301B-301D generated in elements 22B-22D, respectively. The photocurrents generated in each of photosensitive elements 22A-22D may be proportional to the rate at which the optical energy from the distant source impinges on them. Based on the photocurrent generated in its corresponding element 22A-22D, each amplifier 302A-302D may generate a set of analog signals, 306A-306D, respectively.

The variables $S_A$-$S_D$ in Equations (1) and (2) above may correspond to analog signals 306A-306D, or digital representations thereof, in particular. As seen in Equations (1) and (2), the sum of the variables provides a normalization factor in determining $\alpha_x$ and $\alpha_y$. The sum corresponds to the intensity of optical radiation falling on detector 11 and thus, the sum of signals 306A-306D may be proportional to the intensity of optical radiation impinging on detector array 12, provided the amplifiers 302A-302D are operating in their active region. During calibration of system 10, an optical source having a known intensity may be used to set the gain of amplifiers 302A-302D. However, in operation, as the source moves further off axis and, correspondingly, its image spot moves toward the periphery of detector array 12 as described above in conjunction with FIGS. 2D and 2E, the signals corresponding to detector elements that are outside of the image spot, e.g. signals 306A, 306B corresponding to photosensitive elements 22A, 22B, may be dominated by noise. As an image spot moves further toward the periphery, the photoelectric currents from the exposed detector elements, e.g. photosensitive elements 22C, 22D, FIG. 2E, continue to drop as the exposed area of the detector elements diminishes. Concomitantly, noise is increasingly dominating the signals from the exposed detector elements, e.g. signals 306C, 306D corresponding to photosensitive elements 22C, 22D. Consequently, the normalization represented by the denominators in Equations (1) and (2) may begin to break down, as described further below.

A digital value representing of each of the set of signals 306A-306D may be generated by ADC 304, which may be a multichannel ADC. Alternatively, ADC 304 may be implemented using a plurality of single channel ADCs without changing the principles of the disclosed embodiments. The corresponding digital representations, or simply digital values, 308A-308D, corresponding to the set of analog signals 306A-306D may be multiplexed, via a multiplexer (MUX) 310 onto a serial bus 312. Serial bus 312 may be a bus of the type used for communication between a processor and peripheral devices, or between peripheral devices themselves, in a computer system. Examples include a peripheral component interface (PCI) bus, a universal serial bus (USB), an inter-integrated circuit (I²C) bus, a serial-peripheral interface (SPI) bus, and the like. Again, any suitable serial bus architecture may be used. Further, in at least some embodiments, an ADC 308 having an internal serial bus interface may be used, and MUX 310 omitted. The digital values 308A-308D may be communicated to a processor 314 which may be a central processing unit (CPU) or a microcontroller (MCU), for example. In particular, processor 314 may be an MCU having an integrated serial interface corresponding to the bus architecture of bus 312. In still other embodiments, a processor having a suitable set of parallel ports may be used and coupled to ADC 304 without the use of MUX 310. For example, if the digital values 308A-308D are 16 bits (two bytes) wide, a processor having parallel ports with a width of at least two bytes may be used. Digital values 308A-308D, corresponding to the variables $S_A$, $S_B$, $S_C$, and $S_D$ in Equations (1) and (2) above, may be used by processor 314 to generate the angles of incidence $\alpha_x$ and $\alpha_y$.

Corresponding to the variables $S_A$, $S_B$, $S_C$, and $S_D$, the sum of the digital values 308A-308D may likewise be proportional to the intensity of the optical radiation impinging on detector array 12. Thus the sum of value 308A-308D may provide the normalization in the digital domain with respect to the determination of $\alpha_x$ and $\alpha_y$, as seen in Equations (1) and (2). As an image of a distant source moves off-axis, as described above, the analog signals 306A-306D may become dominated by noise, which will thus be reflected in the respective digital values 308A-308D. The angles of incidence $\alpha_x$ and $\alpha_y$ then calculated by processor 314, rather than saturating at ±1, may return a value smaller than 1 in magnitude. Stated differently, an ambiguity in the angles of incidence may arise in which the calculated angle is representative of an object within the linear FOV of detector system 10 although its image spot is near the periphery of detector array 12. Detecting such an ambiguity will now be described in conjunction with the exemplary embodiments.

Returning to detector 11A, outer ring 13 may be electrically coupled to another amplifier, 302E. As described above in conjunction with FIGS. 2, 2A-2E, an image spot from a distant source disposed sufficiently off of the optical axis of an optical sensor system 10 may fall outside of the periphery of detector array 12 and onto outer ring 13. A photocurrent 301E may thereby be generated by an outer ring 13 comprising a photosensitive material. The photocurrent may be proportional to the optical power impinging on the outer ring beyond the periphery of detector array 12. The photocurrent may be amplified by amplifier 302E and the amplified analog signal 306E also coupled to and digitized by ADC 304. The digital value 308E representing the analog signal 306E from amplifier 302E may also be communicated to processor 314. Processor 314 may, for example, compare the digital value against a threshold value, which may be used to signal an ambiguity condition in the determination of the angles of incidence as described above. By way of example, if the digital value exceeds the threshold value, processor 314 may set an interrupt that causes a jump to a software routine that steers a tracking system to move in a direction so as to center the distant source in system 10. The threshold value may, in at least some embodiments be a normalized threshold value. For example, the normalized threshold value may be specified relative to the total energy impinging on the detector 11. Alternatively, the normalized threshold value may be specified relative to the optical energy impinging on detector array 12. In either exemplary embodiment, the normalized threshold value may be expressed as a percentage. The normalized threshold value may be preselected based on the portion of the optical energy impinging on the outer ring exceeding a threshold energy and may be normalized as described above. By way of further example, the relationship of the normalized threshold value and the normalized threshold energy impinging on the outer ring may be based on the properties of the light from the source, the characteristics of the particular photosensitive material used in the fabrication of detector 11A, the gain of the amplifiers, the geometry of outer ring 13, and the like. The normalized threshold value may be set during a calibration of system 10 using a calibration test object having known and variable angles of incidence, and a known intensity.

A reference potential 316, which may be a ground return for amplifiers 302A-302E, labeled G, may be coupled to guard ring 15, which may also provide a return for photocurrents 301A-301E.

Figure 3B:
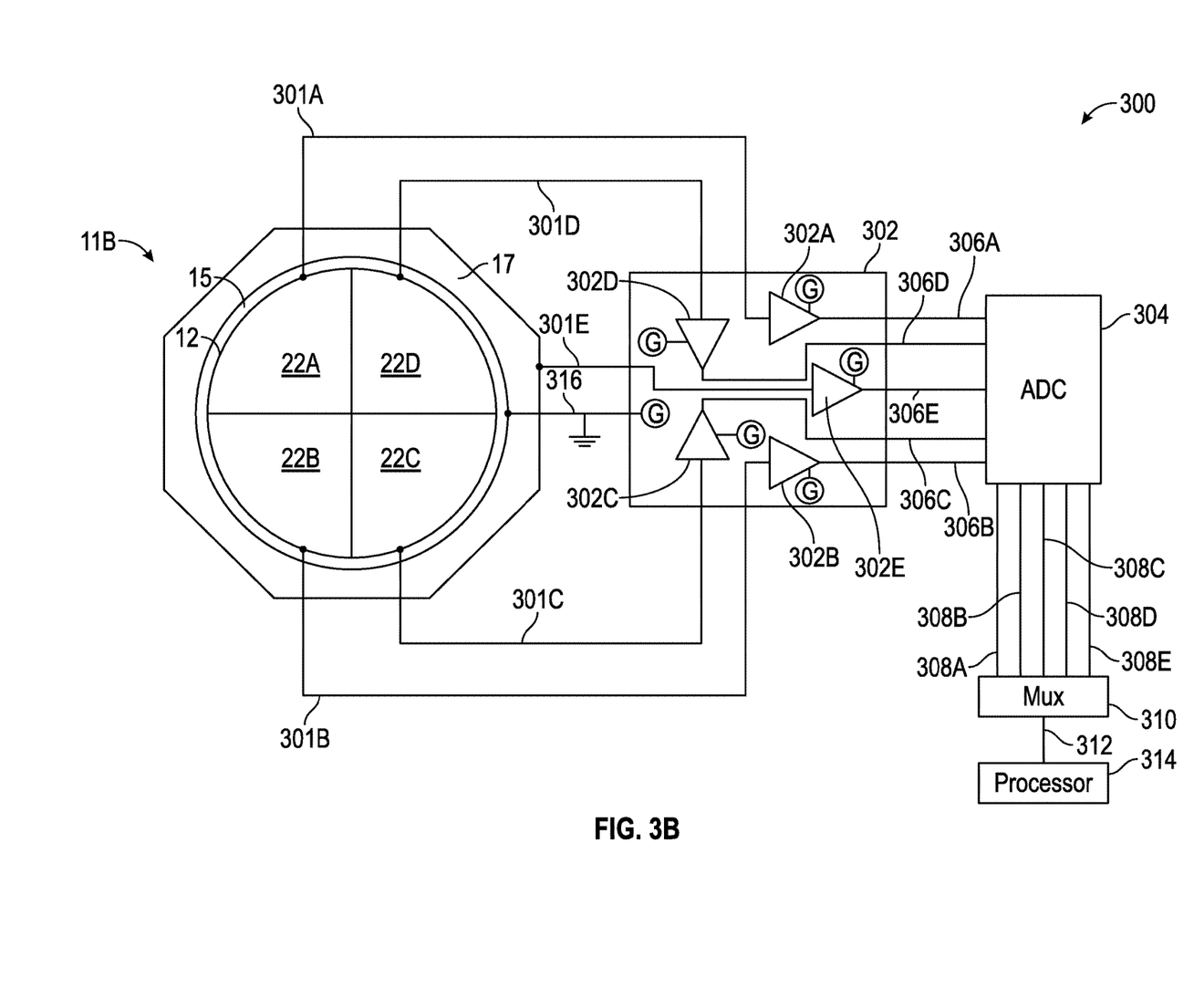
FIG. 3B shows a block diagram of a detector and electrical circuitry in accordance with at least some embodiments.

FIG. 3B shows a detector 11B coupled to electrical circuitry 300 in accordance with at least some other embodiments. The embodiment in FIG. 3B is similar to that in FIG. 3A in which in detector 11B the outer ring 13 of detector 11A is omitted. Detector 11B includes peripheral region 17 which may be used to effect ambiguity detection. Peripheral region 17 is electrically coupled to amplifier 302E, which functions as described in conjunction with FIG. 3A. Likewise, ADC 304, MUX 310 and processor 318 also function as described in conjunction with FIG. 3A. Because the geometry and other properties of peripheral region 17 may differ from outer ring 13 in the embodiment in FIG. 3A, the threshold value may be calibrated differently between the embodiments. However, the ambiguity detection and actions predicated thereon would be understood to be analogous.

Figure 4:
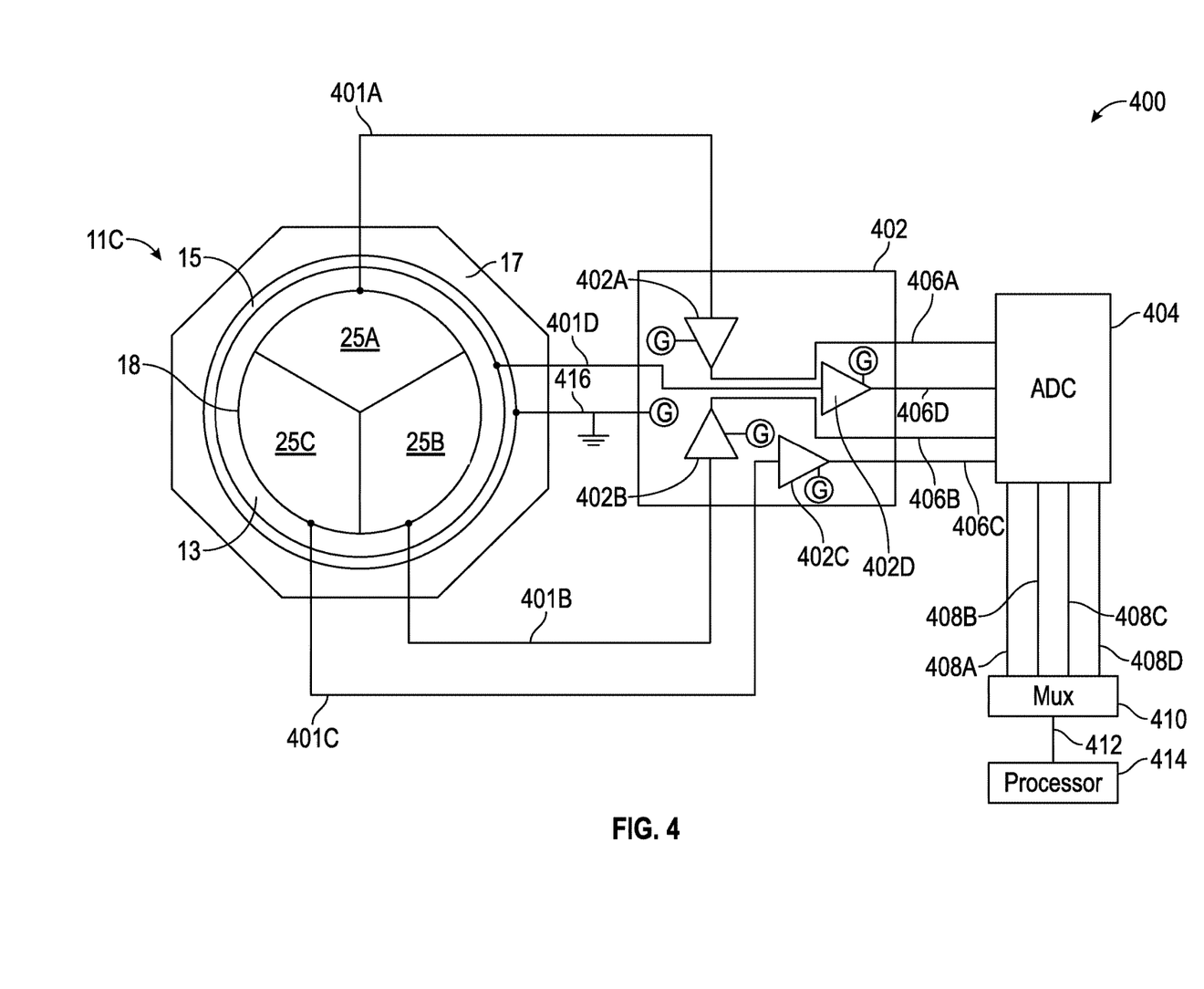
FIG. 4 shows a block diagram of a detector and electrical circuitry in accordance with at least some embodiments.

Refer now to FIG. 4 illustrating a detector 11C coupled to electrical circuitry 400. Detector 11C includes a detector array 18 having three photosensitive elements 25A-25C. An outer ring 13 is disposed about photosensitive elements 25A-25C and may be fabricated from the same photosensitive material as detector array 18. Detector 11C also includes a guard ring 15 and a peripheral region 17. As previously described, in at least some embodiments, peripheral region 17 may be omitted or removed in fabrication of detector 11C. Each of elements 25A-25C is coupled to a respective amplifier 402A-402C in amplifier block 402. Similar to amplifier block 302, amplifier block 402 may be an integrated circuit having a plurality of independent amplifiers, or alternatively may comprise individual discrete amplifiers or other combinations of integrated and discrete amplifiers. The particular implementation architecture of amplifier block 402 does not implicate the principles of the disclosure as embodied therein.

The photocurrents generated in each of elements 25A-25C may be proportional to the optical power impinging on them from the distant source. Based on the photocurrent generated in its corresponding element 25A-25C, each amplifier 402A-402C may generate a set of analog output signals, 406A-406C, respectively, based on the photocurrent. A digital value representing of each of signals 406A-406C may be generated by ADC 404, which may be a multichannel ADC. Alternatively, ADC 404 may be implemented using a plurality of single channel ADCs without changing the principles of the disclosed embodiments. The corresponding digital representations, or simply digital values, 408A-408C, corresponding to analog signals 406A-406C, may be multiplexed, via a multiplexer (MUX) 410 onto a serial bus 412. Serial bus 412 may be a bus of the type used for communication between a processor and peripheral devices, or between peripheral devices themselves, in a computer system. Examples include a peripheral component interface (PCI) bus, a universal serial bus (USB), an inter-integrated circuit ($I^2C$) bus, a serial-peripheral interface (SPI) bus, and the like. Again, any suitable serial bus architecture may be used. Further, in at least some embodiments, an ADC 408 having an internal serial bus interface may be used, and MUX 410 omitted.

The digital values 408A-408C may be communicated to a processor 414 which may be a central processing unit (CPU) or a microcontroller (MCU), for example. In particular, processor 414 may be an MCU having an integrated serial interface corresponding to the bus architecture of bus 412. As described above, a processor having parallel ports of the appropriate width may also be used to couple to ADC 408. Again, the particular implementation architecture of communication links between ADC 404 and processor 414 do not implicate the principles embodied in detector 11C and electrical circuitry 400 coupled thereto. In an exemplary embodiment of a detector array 18 in which elements 25A-25C have 3-fold symmetry, as illustrated in FIG. 4, for example, the boundary between elements 25A and 25B, and elements 25A and 25C make an angle of 30° with the positive and negative horizontal, or X-axis, respectively. In such an embodiment, analogous to digital values 308A-308D, digital values 408A-408C may be used by processor 414 to generate the angles of incidence $\alpha_x$ and $\alpha_y$ in accordance with Equations (3) and (4):

$$a_x = \frac{\sqrt{3}}{2}(S_B - S_C)/(S_A + S_B + S_C) \quad (3)$$

$$a_y = \left(S_A - \frac{1}{2}(S_B + S_C)\right)/(S_A + S_B + S_C) \quad (4)$$

where the variables $S_A$-$S_C$ correspond to the values 408A-408C, respectively. Recall, angles $\alpha_x$ and $\alpha_y$ are normalized; un-normalized angles may be determined based on a scaling obtained via a calibration using a source having a known angular position as previously described. This calibration may also correct for distortions arising from the non-orthogonality of the boundaries between elements 25A-25C of the detector array.

Returning to detector 11C, outer ring 13 may be electrically coupled to another amplifier, 402D. Similar to FIGS. 3A and 3B, an image spot from a distant source at sufficiently large angles of incidence may fall outside of the periphery of detector array 18 and onto outer ring 13. A photocurrent 401D may thereby be generated by an outer ring 13 comprising a photosensitive material. The photocurrent may be proportional to the rate at which optical energy impinges on the outer ring beyond the periphery of detector array 18. The photocurrent may be amplified by amplifier 402D and the amplified analog signal 406D also coupled to and digitized by ADC 404. The digital value 408D representing the analog signal 406D from amplifier 402D may also be communicated to processor 414. Processor 414 may, for example, compare the digital value against a threshold value, which may be used to signal an ambiguity condition in the determination of the angles of incidence as described above. By way of example, if the digital value exceeds the threshold value, processor 414 may set an interrupt that causes a jump to a software routine that steers a tracking system to move in a direction so as to center the distant source in system 10. The threshold value may be based on the properties of the light from the source, the characteristics of the particular photosensitive material used in the fabrication of detector 11C, the gain of the amplifiers, the geometry of outer ring 13, and the like. The threshold value may be set during a calibration of system 10. A reference potential 416, which may be a ground return for amplifiers 402A-302D, may be coupled to guard ring 15, which may also provide a return for photocurrents 401A-401D.

In an alternative embodiment (not shown in FIG. 4), detector 11C may omit outer ring 13 and couple peripheral region 17 to amplifier 402D, similarly to detector 11B, above. Likewise, the threshold value in such an embodiment may be calibrated differently than that in the embodiment having the outer ring. However, as would be appreciated by one skilled in the art having the benefit of the disclosure, the ambiguity detection and actions predicated thereon are similar.

Figure 5:
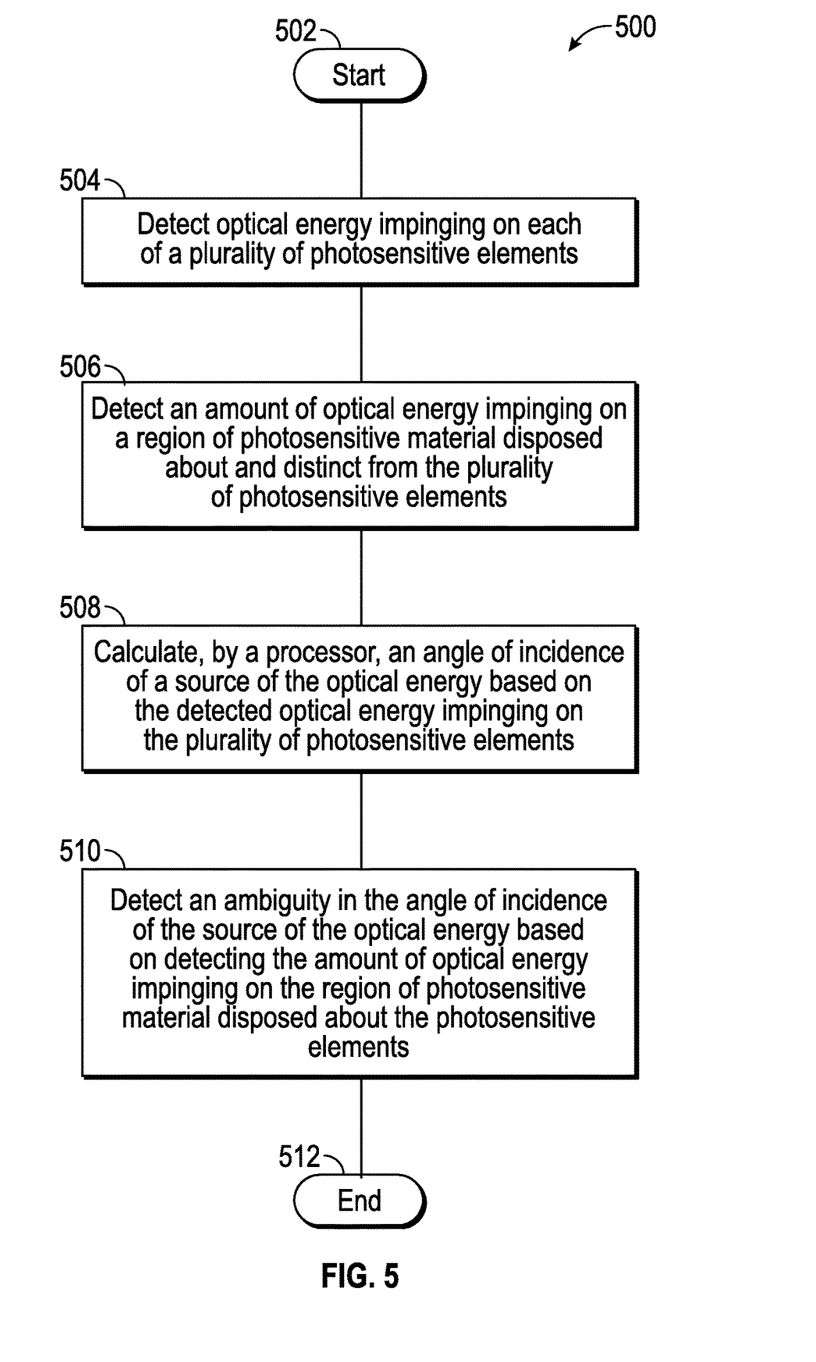
FIG. 5 shows a flow chart of a method in accordance with at least some embodiments.

Refer now to FIG. 5 showing a flow chart of a method 500 in accordance with at least some embodiments. Method 500 starts at block 502. In block 504, optical energy impinging on each of a plurality of photosensitive elements is detected. For example, a photocurrent in each of the elements of the plurality may be detected in which the photocurrent is based on the optical energy impinging on the respective photosensitive element. An amount of optical energy impinging on a photosensitive region disposed about and distinct from the plurality of photosensitive elements is detected, block 506. At block 508, an angle of incidence of a source of the optical energy is calculated by a processor based on the detected optical energy impinging on the plurality of photosensitive elements. By way of example, in an embodiment in which the plurality of photosensitive elements has three such elements, the angles of incidence may be calculated by a processor, e.g. processor 314, based on the difference of the values of signals $S_B$ and $S_C$, and the difference of the values of signal $S_A$ and one-half the sum of the values of signals $S_B$ and $S_C$, in accordance with Equations (3) and (4), above. In another exemplary embodiment having a four-element detector array, the angles of incidence may be calculated by the processor based on Equations (1) and (2).

In block 510, an ambiguity in the angle of incidence is detected based on the detected amount of optical energy impinging on the photosensitive region disposed about the plurality of photosensitive elements. The ambiguity may be detected, for example, if optical energy impinging on the photosensitive region generates a photocurrent in which a signal value based on the photocurrent exceeds a preselected threshold value. By way of further example, if the ambiguity is detected in an embodiment in which the photosensitive elements are disposed in an optical sensor system, the optical sensor system may be steered such that the ambiguity is no longer detected. The optical sensor system may thereby be steered such that the source of the optical energy is within the linear field of view of the optical sensor system. Method 500 ends at block 512.

The above discussion is meant to be illustrative of the principles and various embodiments of the present invention. Numerous variations and modifications will become apparent to those skilled in the art once the above disclosure is fully appreciated. For example, various lens configurations may be employed in the implementation of a converging lens system. Similarly, the various active electronic components may be implemented in combinations of discrete devices, combinations of integrated devices, combinations of integrated and discrete devices, or on a single application specific integrated circuit (ASIC). It is intended that the following claims be interpreted to embrace all such variations and modifications.

What is claimed is:

1. An apparatus comprising:
    a detector array having a plurality of elements, the detector array comprising a photosensitive material;
    a photosensitive region disposed about and distinct from the plurality of elements of the detector array;
    electrical circuitry coupled to each of the elements of the detector array, the electrical circuitry configured to generate a set of first signals, each first signal of the set of first signals is based on optical energy impinging on a respective one of the plurality of elements of the detector array; and
    wherein the photosensitive region is coupled to the electrical circuitry; and
    wherein the electrical circuitry is further configured to generate a second signal having a first value if no portion of optical energy impinging on the plurality of elements of the detector array impinges on the region disposed about the plurality of elements of the detector array, and having a second value, distinct from the first value, if a portion of optical energy impinging on the plurality of elements of the detector array impinges on the photosensitive region and exceeds a threshold energy.

2. The apparatus of claim 1 wherein the detector further comprises a guard ring disposed about the plurality of elements, the guard ring being coupled to a reference potential of the electrical circuitry.

3. The apparatus of claim 1 wherein the photosensitive material forms a photosensitive device selected from the group consisting of:
    a photodiode;
    a phototransistor;
    an avalanche photodiode; and
    a charge-coupled device.

4. The apparatus of claim 1 wherein the electrical circuitry is further configured to generate an angle of incidence of a source of the optical energy based on the set of first signals.

5. The apparatus of claim 4 wherein the electrical circuitry is further configured to detect an ambiguity in the angle of incidence based on the second signal.

6. The apparatus of claim 5 wherein the electrical circuitry comprises:
    a plurality of amplifiers, each amplifier of the plurality coupled to a respective one of the plurality of photosensitive elements of the detector array and
    a plurality of analog to digital convertors (ADCs), each ADC coupled to one of the plurality of amplifiers and generating a digital representation of a corresponding analog signal from a corresponding one of the plurality of amplifiers, and wherein each first signal of the set of first signals comprises one of the corresponding digital representations;
    an amplifier coupled to the photosensitive region disposed about the plurality of elements of the detector array; and
    an ADC electrically connected to the amplifier coupled to the photosensitive region disposed about the plurality of elements of the detector array and generating the second signal based on an analog signal from the amplifier coupled to the photosensitive region disposed about the plurality of elements and wherein:
        the second signal has a first value if the analog signal from the amplifier coupled to the photosensitive region is less than a threshold value based on the threshold energy, and has a second value if the analog signal from the amplifier coupled to the photosensitive region is greater than the threshold value.

7. The apparatus of claim 6 wherein the plurality of elements comprises four elements.

8. The apparatus of claim 6 wherein the plurality of elements comprises three elements.

9. A method comprising:
    detecting an amount of optical energy impinging on each of a plurality of photosensitive elements;
    detecting an amount of optical energy impinging on a region of photosensitive material disposed about and distinct from the plurality of photosensitive elements;
    calculating, by a processor, an angle of incidence of a source of the optical energy based on the amount of detected optical energy impinging on the plurality of photosensitive elements; and
    detecting an ambiguity in the angle of incidence of the source of the optical energy based on the amount of detected optical energy impinging on the region of photosensitive material disposed about the plurality of photosensitive elements.

10. The method of claim 9 wherein each of the photosensitive elements comprises a photosensitive material selected from the group consisting of:
    a photoconductor; and
    a photoresistor; and wherein:
        the photosensitive material forms a photosensitive device selected from the group consisting of:
        a photodiode;
        a phototransistor;
        an avalanche photodiode; and
        a charge-coupled device.

11. The method of claim 9 wherein the plurality of photosensitive elements comprises four elements, and the detecting the amount of optical energy impinging on the plurality of photosensitive elements comprises detecting a photocurrent in each of the four photosensitive elements, and wherein the photocurrent in each of the four elements is based on the amount of optical energy impinging on the photosensitive element.

12. The method of claim 9 wherein the plurality of photosensitive elements comprises three elements, and the detecting the amount of optical energy impinging on the plurality of photosensitive elements comprises detecting a photocurrent in each of the three photosensitive elements, and wherein the photocurrent in each of the three elements is based on the amount of optical energy impinging on the photosensitive element.

13. The method of claim 12 wherein the calculating the angle of incidence comprises:
calculating, by the processor, a first sum by summing a first signal value from a first one of the three photosensitive elements and a second signal value from a second one of the three photosensitive elements, the second one distinct from the first one of the three photosensitive elements;
calculating, by the processor, a normalization factor by summing the first signal value, the second signal value and a third signal value from a third one of the three photosensitive elements, the third one distinct from the first and second ones of the three photosensitive elements;
calculating, by the processor, a first difference value by subtracting one-half the first sum from the third signal value;
calculating, by the processor, a second difference value by subtracting the second signal value from the first signal value;
calculating, by the processor, a first angle in a first direction based on the first difference value; and
calculating, by the processor, a second angle in a second direction different from the first direction based on the second difference value.

14. The method of claim 9 wherein detecting an ambiguity of the angle of incidence comprises determining if a signal value based on the photocurrent in the region of photosensitive material disposed about the plurality of photosensitive elements exceeds a preselected threshold value.

15. The method of claim 9 wherein the plurality of photosensitive elements and the photosensitive region are disposed within an optical sensor system, the method further comprising, on detecting an ambiguity in the angle of incidence, steering the optical sensor system so that the angle of incidence of the source of the optical energy is ambiguity-free.

16. The method of claim 15 wherein steering the optical sensor system comprises steering the optical sensor system so that the source of the optical energy is within a linear field of view of the optical sensor system.

17. An optical sensor system comprising:
a photodetector comprising:
a plurality of photosensitive elements; and
a photosensitive region disposed about and distinct from the photosensitive elements;
an optical system configured to image optical energy on the photodetector; and
electrical circuitry coupled to each of the photosensitive elements and to the photosensitive region disposed about the plurality of photosensitive elements, the electrical circuitry configured to generate a set of first signals, each first signal of the set of first signals based on a portion of the optical energy impinging on a respective one of the plurality of photosensitive elements, and generating a second signal based on a portion of the optical energy impinging on the photosensitive region disposed about the plurality of photosensitive elements, and wherein:
the second signal has a first value if no portion of the optical energy impinges on the photosensitive region and a second value if some portion of the optical energy impinges on the photosensitive region disposed about the plurality of optical elements.

18. The system of claim 17 wherein the plurality of elements comprises a photosensitive material selected from the group consisting of:
a photoconductor; and
a photoresistor.

19. The system of claim 17 wherein the electrical circuitry comprises:
a plurality of analog to digital converters (ADCs), wherein:
an ADC is configured to convert an analog signal based on the portion of optical energy impinging on a corresponding element of the plurality of photosensitive elements to a corresponding first signal of the set of first signals, wherein each of the first signals comprises a digital representation of the respective analog signal, each of the analog signals based on the portion of optical energy impinging on the corresponding element of the plurality of photosensitive elements; and
another ADC of the plurality is configured to convert an analog signal based on optical energy impinging on the photosensitive region disposed about the plurality of photosensitive elements to the second signal, the second signal comprising a digital representation of the analog signal based on optical energy impinging on the photosensitive region disposed about the plurality of photosensitive elements;
a processor coupled to the plurality of ADCs, the processor configured to: calculate an angle of incidence of a source of the optical energy based on the set of first signals; and
detect an ambiguity of the angle of incidence based on the second value of the second signal exceeding a threshold value.

20. An apparatus comprising:
a detector array having three detector elements, each detector element comprising a photosensitive material;
electrical circuitry coupled to each of the three detector elements, the electrical circuitry configured to generate a set of first signals, each signal of the set of first signals based on optical energy impinging on a respective one of the three detector elements; and
wherein the electrical circuitry is further configured to generate an angle of incidence of a source of the optical energy based on the set of first signals; and
wherein the electrical circuitry comprises:
first, second and third amplifiers, each of the first, second and third amplifiers having a respective input connection coupled to one of the three detector elements
first, second and third analog-to-digital convertors (ADCs), each of the first, second and third ADCs configured to receive an output signal from the first, second and third amplifiers, respectively, and generate a digital representation thereof; and
a processor configured to receive the digital representation of each output signal from the first, second and third ADCs and determine the angle of incidence of the source of the optical energy based upon the digital representation of the output signal from each of the first, second and third amplifiers.

21. The apparatus of claim 20 further comprising:
a photosensitive region disposed about and distinct from the three detector elements and coupled to a fourth amplifier;

a fourth ADC configured to receive an output signal from the fourth amplifier and generate a digital representation thereof; and wherein the processor is further configured to generate an ambiguity signal if the digital representation of the output signal from the fourth amplifier exceeds a threshold value.

* * * * *